(12) United States Patent
Sawada et al.

(10) Patent No.: US 7,903,298 B2
(45) Date of Patent: Mar. 8, 2011

(54) IMAGE READING APPARATUS, AND ITS MANUFACTURING METHOD

(75) Inventors: Hideki Sawada, Kyoto (JP); Norihiro Imamura, Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 0 days.

(21) Appl. No.: 12/224,011

(22) PCT Filed: Feb. 13, 2007

(86) PCT No.: PCT/JP2007/052464
§ 371 (c)(1),
(2), (4) Date: Mar. 30, 2010

(87) PCT Pub. No.: WO2007/094286
PCT Pub. Date: Aug. 23, 2007

(65) Prior Publication Data
US 2010/0195166 A1    Aug. 5, 2010

(30) Foreign Application Priority Data

Feb. 15, 2006    (JP) .................... 2006-038326

(51) Int. Cl.
*H04N 1/04* (2006.01)
(52) U.S. Cl. ......... 358/484; 358/482; 358/483; 358/475; 358/496; 358/497
(58) Field of Classification Search .......... 358/484, 358/483, 482, 497, 494, 474, 496, 512–514, 358/505, 509; 250/208.1, 239, 216, 234–236, 250/227.11; 362/600, 608–610, 615, 632–634, 362/551; 399/211, 212, 221, 220; 355/67, 355/68
See application file for complete search history.

(56) References Cited

U.S. PATENT DOCUMENTS

| | | | |
|---|---|---|---|
| 5,859,421 A | 1/1999 | Onishi et al. | |
| 6,259,082 B1 | 7/2001 | Fujimoto et al. | |
| 6,268,600 B1 | 7/2001 | Nakamura et al. | |
| 6,455,834 B2 * | 9/2002 | Fujimoto et al. | 250/208.1 |
| 7,316,353 B2 | 1/2008 | Ikeda et al. | |
| 2006/0050390 A1 | 3/2006 | Sawada | |
| 2006/0098247 A1 | 5/2006 | Sawada | |
| 2009/0027739 A1 * | 1/2009 | Onishi et al. | 358/475 |
| 2009/0034024 A1 * | 2/2009 | Kim et al. | 358/475 |
| 2009/0034030 A1 * | 2/2009 | Nagatani et al. | 358/509 |
| 2009/0034285 A1 * | 2/2009 | Lee et al. | 362/555 |

(Continued)

FOREIGN PATENT DOCUMENTS

CN    1637343    7/2005

(Continued)

*Primary Examiner* — Cheukfan Lee
(74) *Attorney, Agent, or Firm* — Hamre, Schumann, Mueller & Larson, P.C.

(57) ABSTRACT

An image reader A1 according to the present invention comprises a pair of light source devices 3, a light guide member 4, a first and a second reflectors 7A and 7B, a plurality of light receiving elements 5, and a case 1. The image reader A1 further includes a first fitting contrivance 71 for positioning the first reflector 7A relative to the case 1 by inserting the first reflector 7A into the case 1 in the insertion direction z, a second fitting contrivance 72 for positioning the light guide member 4 relative to the case 1 by inserting the light guide member 4 into the case 1 in the insertion direction z, and a third fitting contrivance 73 for positioning the second reflector 7B relative to the case 1 by inserting the second reflector 7B into the case 1 in the insertion direction z.

7 Claims, 11 Drawing Sheets

FOREIGN PATENT DOCUMENTS

| | | |
|---|---|---|
| JP | 8-43633 | 2/1996 |
| JP | 9-307696 | 11/1997 |
| JP | 10-190959 | 7/1998 |
| JP | 11-52136 | 2/1999 |
| JP | 2004-266313 | 9/2004 |
| WO | WO 2004/054232 | 6/2004 |

\* cited by examiner

IMAGE READING APPARATUS, AND ITS MANUFACTURING METHOD

TECHNICAL FIELD

The present invention relates to an image reader and a manufacturing method thereof.

BACKGROUND ART

FIGS. 11 and 12 show an example of conventional image reader. FIG. 12 is a sectional view taken along lines XII-XII in FIG. 11. The conventional image reader X reads the content of a document Dc as image data. The document Dc is transferred in the secondary scanning direction, which is the right and left direction in FIG. 12, by e.g. a platen roller Pr. The image reader X includes a case 91, a substrate 92, a light source device 93, a light guide member 94, sensor IC chips 95, a lens array 96, a transparent plate 97 and a pair of reflectors 98A, 98B.

The case 91 is narrow and elongated in the primary scanning direction which is the right and left direction in FIG. 11 (i.e., perpendicular to the secondary scanning direction). The substrate 92 has an elongated rectangular shape extending in the primary scanning direction and is fitted in the case 91. The light source device 93 emits light for reading an image. The light source device 93 is mounted on the substrate 92.

The light guide member 94 is made of a transparent resin and directs the light emitted from the light source device 93 toward the document Dc. The light guide member 94 is narrow and elongated in the primary scanning direction. The light guide member 94 includes a light incident surface 94a, a reflecting surface 94b and a light emitting surface 94c.

The light incident surface 94a faces the light source device 93. The light emitted from the light source device 93 enters the light guide member 94 through the light incident surface 94a. The reflecting surface 94b is inclined with respect to the primary scanning direction. The light traveling from the light incident surface 94a is reflected by the reflecting surface 94b in the primary scanning direction. The light emitting surface 94c is narrow and elongated in the primary scanning direction. The light traveling through the light guide member 94 is emitted from the light emitting surface 94c toward the document Dc as linear light extending in the primary scanning direction.

The paired reflectors 98A and 98B may be made of a white resin, for example. The reflectors 98A and 98B prevent light from leaking from the light guide member 94.

The light emitted from the light guide member 94 passes through the transparent plate 97 to impinge on the document Dc and is reflected by the document Dc. The reflected light is converged onto the plurality of sensor IC chips 95 by the lens array 96.

The sensor IC chips 95 output signals corresponding to the received amount of light. In the image reader X, the signals outputted from the sensor IC chips 95 are stored in a non-illustrated memory. In this way, the image reader X reads the content of the document Dc as an image.

Generally, in manufacturing the image reader X, the light guide member 94 and the reflectors 98A, 98B are assembled into an integral unit, and then, the integral unit is inserted into the case 91. To insert the integral unit into the case, the unit needs to be held properly. Thus, it is difficult to automatically and continuously perform the assembling and insertion of the integral unit, which deteriorates the manufacturing efficiency of the image reader X.

Meanwhile, there are demands for increasing the readable range of the image reader X in the primary scanning direction and making the image reader X slim. To increase the readable range and slim down the image reader X, the light guide member 94 and the reflectors 98A, 98B need to be made narrower and longer. However, such narrow and long light guide member 94 and reflectors 98A, 98B are more likely to undergo deformation such as warping or twisting. Thus, when such light guide member 94 and reflectors 98a, 98B are assembled into an integral unit, deformation may appear in the integral unit. To mount such a deformed integral unit to a predetermined position in the case 91 is difficult, so that the manufacturing efficiency is deteriorated. Further, the deformed unit causes other drawbacks such as failure of the image reading.

Patent Document 1: JP-A-2004-266313

DISCLOSURE OF THE INVENTION

The present invention has been proposed under the circumstances described above. It is, therefore, an object of the present invention is to provide an image reader capable of enhancing the positioning accuracy in mounting the light guide member and the reflector, and a method for manufacturing such an image reader.

According to a first aspect of the present invention, there is provided an image reader comprising a light source, a light guide member elongated in a primary scanning direction for directing light from the light source to an object to be read as linear light extending in the primary scanning direction, a first and a second reflectors elongated in the primary scanning direction and sandwiching the light guide member, a plurality of light receiving elements arranged in the primary scanning direction for receiving light reflected by the object to be read, and a case formed with an opening for inserting the light guide member and the first and the second reflectors in an insertion direction which is perpendicular to both of the primary scanning direction and a secondary scanning direction. The first reflector is located deeper in the case in the insertion direction than the second reflector is, with the light guide member intervening between the first and the second reflectors. The image reader further comprises a first fitting contrivance for positioning the first reflector relative to the case by inserting the first reflector into the case in the insertion direction, a second fitting contrivance for positioning the light guide member relative to the case by inserting the light guide member into the case in the insertion direction, and a third fitting contrivance for positioning the second reflector relative to the case by inserting the second reflector into the case in the insertion direction.

Preferably, the image reader further comprises an engagement contrivance for preventing the second reflector from being detached from the case.

Preferably, the first fitting contrivance comprises a first projection projecting from an inner surface of a deeper portion of the case in the insertion direction and a hole formed in the first reflector for fitting to the first projection.

Preferably, the second fitting contrivance comprises a second projection projecting from the light guide member in the insertion direction and a hole formed in the first reflector for fitting to the second projection.

Preferably, the third fitting contrivance comprises an inner surface of the case, a flange formed at the first reflector and a bottom flange formed at the second reflector for fitting into a space defined by the inner surface of the case and the flange of the first reflector.

Preferably, the light guide member includes a pair of light incident surfaces at two ends which are opposite in the primary scanning direction, and the light source comprises a pair of light source devices facing the light incident surfaces.

According to a second aspect of the present invention, there is provided a method for manufacturing the image reader provided according to the first aspect of the present invention. The method comprises inserting the first reflector, the light guide member and the second reflector into the case in the mentioned order.

BEST MODE FOR CARRYING OUT THE INVENTION

Preferred embodiments of the present invention will be described below with reference to the accompanying drawings.

Figure 1:
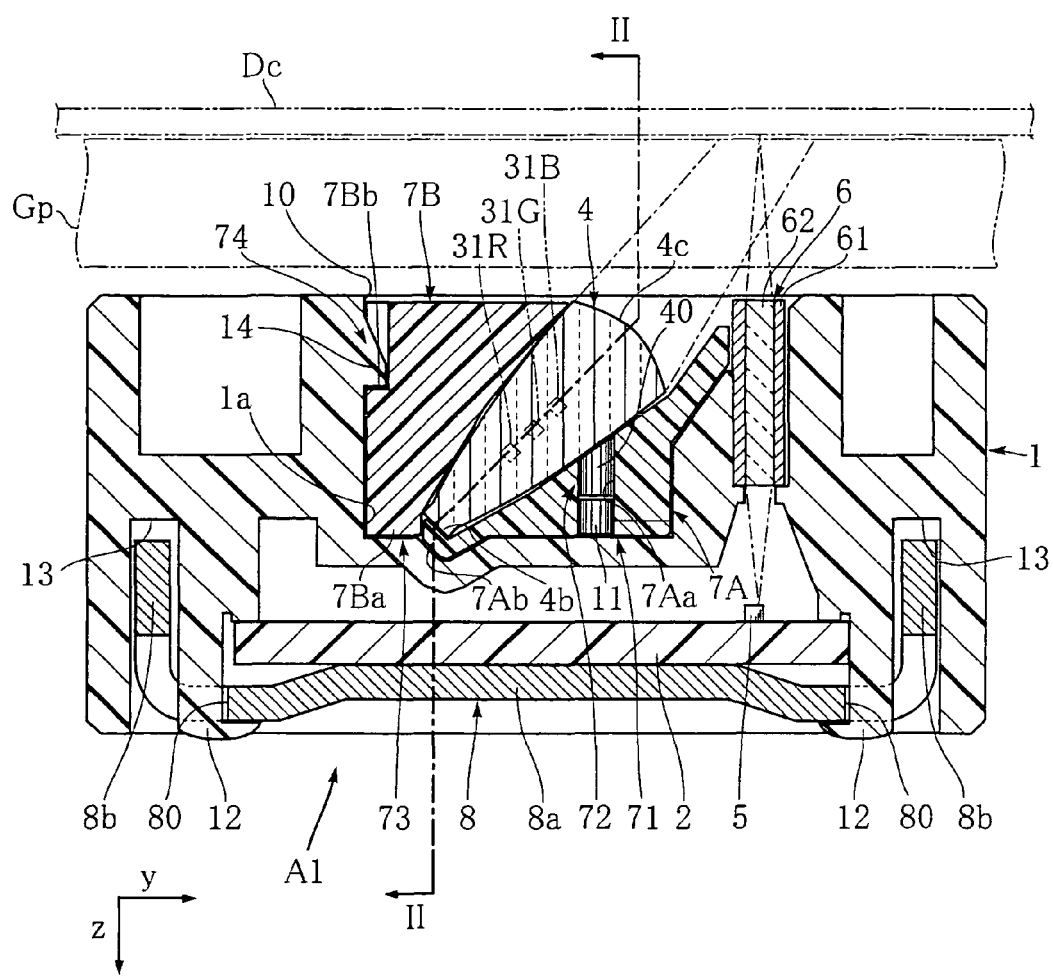
FIG. 1 is a sectional view showing an image reader according to a first embodiment of the present invention.
Figure 2:
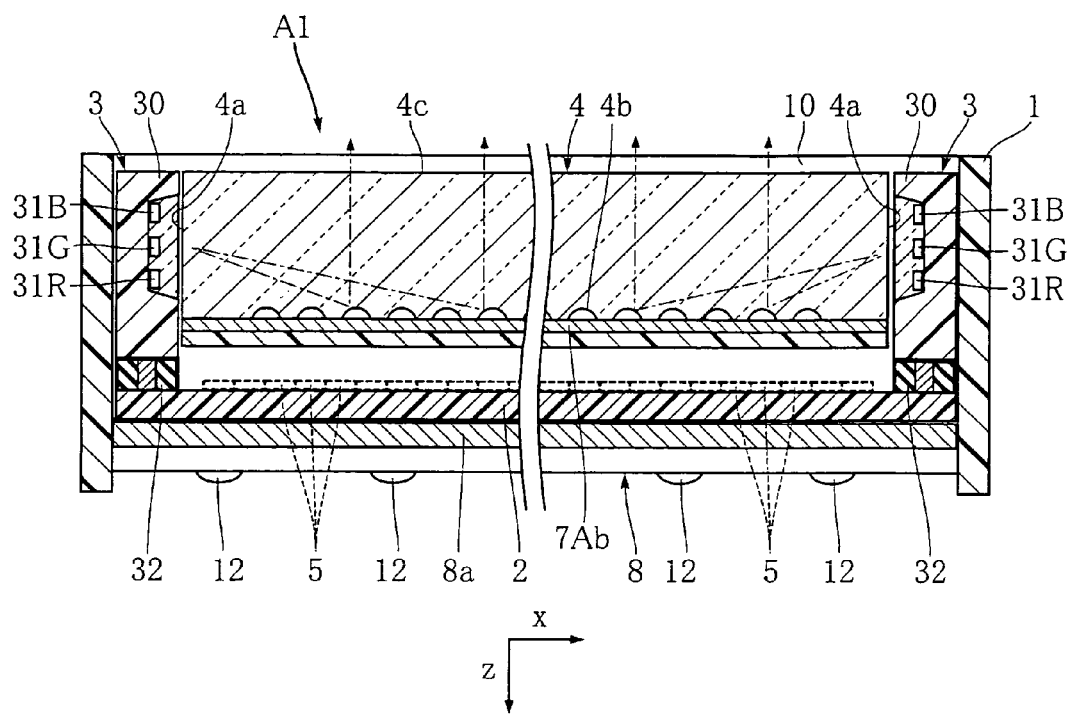
FIG. 2 is a sectional view taken along lines II-II in FIG. 1 for showing a principal portion.
Figure 3:
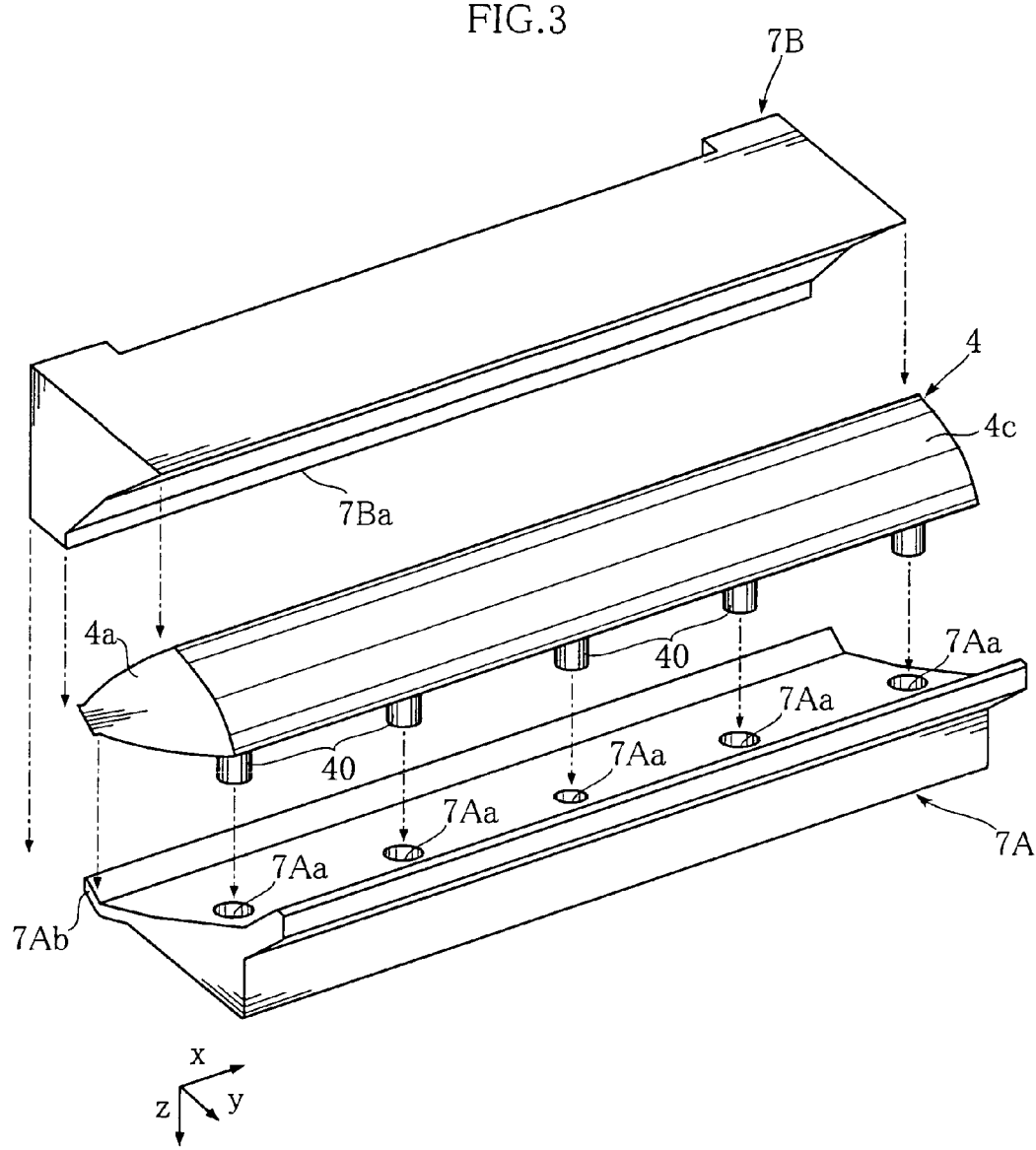
FIG. 3 is a perspective view showing a light guide member and a first and a second reflectors.
Figure 4:
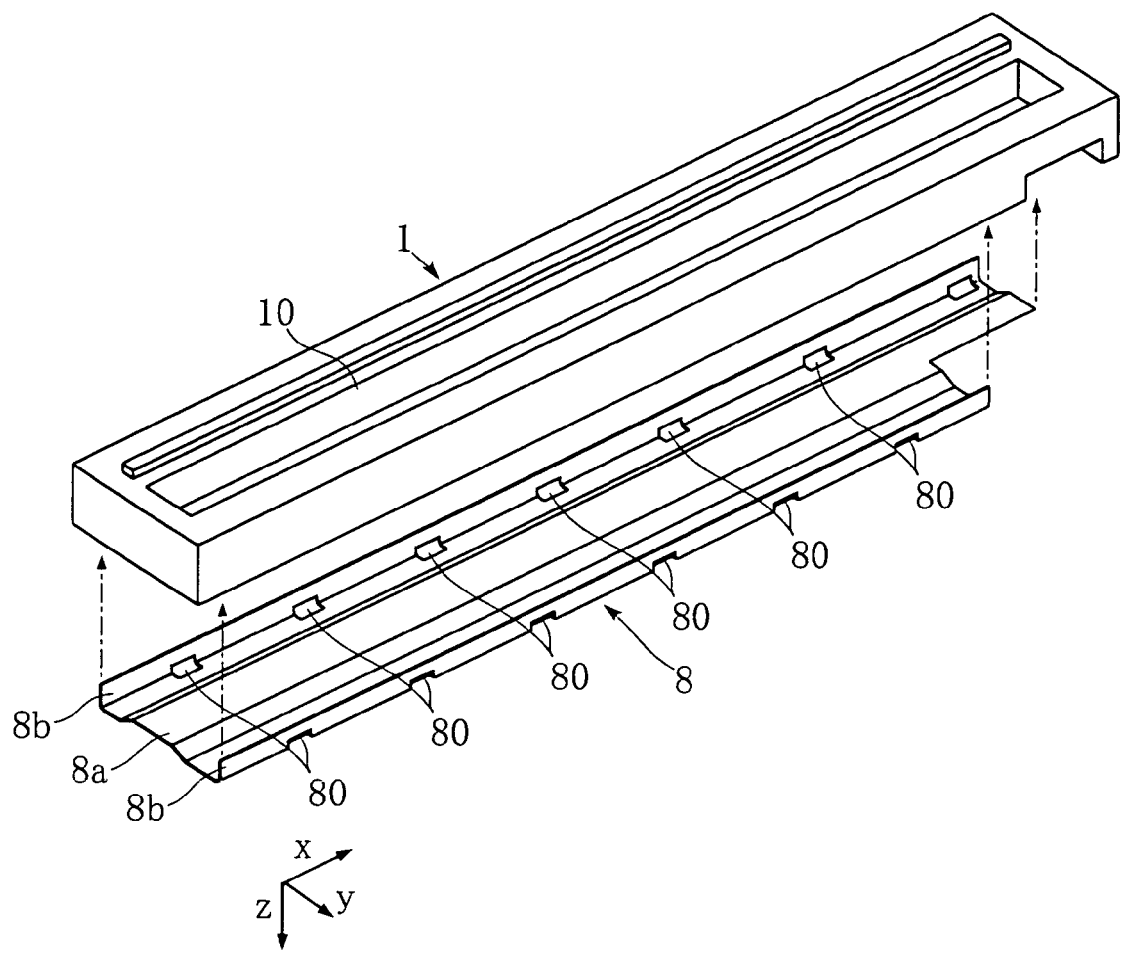
FIG. 4 is a perspective view showing a substrate and an elastic plate.

FIGS. 1-4 show an image reader according to a first embodiment of the present invention. FIG. 2 is a sectional view taken along lines II-II in FIG. 1 for showing a principal portion. FIG. 3 is a perspective view showing a light guide member 4 and a first and a second reflectors 7A and 7B. FIG. 4 is a perspective view showing a substrate 2 and an elastic plate 8. The image reader A1 includes a case 1, a substrate 2, a pair of light source devices 3, a light guide member 4, a plurality of sensor IC chips 5, a first and a second reflectors 7A and 7B, and an elastic plate 8. The image reader A1 reads the content of a document Dc set on e.g. a glass plate Gp as image data.

The case 1 is made of a synthetic resin and generally in the form of a block elongated in the primary scanning direction x (which is perpendicular to the sheet surface of FIG. 1). The case 1 accommodates the substrate 2, the paired light source devices 3, the light guide member 4, the sensor IC chips 5, the lens array 6, the first and the second reflectors 7A and 7B and the elastic plate 8.

The case 1 is formed with an opening 10. The opening 10 is elongated in the primary scanning direction x. The opening 10 is utilized for inserting the light guide member 4 and the first and the second reflectors 7A, 7B into the case 1. The light guide member 4 and the first and the second reflectors 7A, 7B are inserted into the case 1 in an insertion direction z, which is perpendicular to both of the primary scanning direction x and the secondary scanning direction y.

As shown in FIG. 1, the case 1 includes a retreated surface formed with a plurality of projections 11. Each of the projections 11 projects in the insertion direction z and has a circular cross section. The projections 11 are arranged at equal intervals in the primary scanning direction x. The projections 11 are utilized for positioning the first reflector 7A relative to the case 1.

The case 1 is formed with a plurality of engagement portions 12, two grooves 13 and a hook 14. The engagement portions 12 are arranged in two lines extending in the primary scanning direction x. The engagement portions 12 engage the elastic plate 8. The two grooves 13 extend in the primary scanning direction x. The grooves 13 receive part of the elastic plate 8. The hook 14 is an elastically deformable projection. The hook 14 prevents the second reflector 7B from being detached.

The substrate 2 is made of e.g. a ceramic material and pressed against a lower portion of the case 1 by the elastic plate 8. A connector (not shown) for electric power supply and signal input/output is mounted to the substrate 2. The substrate 2 is formed with a wiring pattern (not shown). The wiring pattern electrically connects the connector to the light source devices 3 and each of the sensor IC chips 5.

The paired light source devices 3 emit light to irradiate the document Dc. As shown in FIG. 2, the paired light source devices 3 are arranged to face the two end surfaces of the light guide member 4, respectively.

Each of the light source devices 3 includes a resin package 30 and a plurality of LED elements 31B, 31G and 31R. The resin package 30 is made of e.g. a white resin and holds the LED elements 31B, 31G and 31R. The LED elements 31B, 31G and 31R emit blue light, green light and red light, respectively. As shown in FIG. 1, the LED elements 31B, 31G and 31R are aligned in a direction which is inclined 45 degrees with respect to the secondary scanning direction y.

Each of the light source devices 3 is provided with a plurality of terminals (not shown) electrically connected to the LED elements 31B, 31G and 31R. The terminals are connected to the wiring pattern (not shown) of the substrate 2 via e.g. a rubber connector 32 shown in FIG. 2. The rubber connector 32 comprises a plurality of vertically extending conductive members incorporated in a rubber body.

The light guide member 4 is made of e.g. PMMA (polymethyl methacrylate) and has a high transparency. The light guide member 4 includes a pair of light incident surfaces 4a, a light reflecting surface 4b, a light emitting surface 4c and a plurality of projections 40. The light guide member 4 is about 6 mm in height, about 3 mm in width and about 228 mm in length.

The light emitted from the light source devices 3 enters the light guide member 4 through the paired light incident surfaces 4a. The light incident surfaces 4a comprise two end surfaces of the light guide member 4 which are opposite in the primary scanning direction x. The light incident surfaces 4a are mirror finished to prevent the light from the light source devices 3 from scattering.

The light traveling from the light incident surfaces 4a in the primary scanning direction x is reflected by the light reflecting surface 4b toward the light emitting surface 4c. The light reflecting surface 4b is formed with a plurality of grooves and extends in the primary scanning direction x.

The light emitting surface 4c, from which light is emitted toward the document Dc, extends in the primary scanning direction x. The light emitting surface 4c is arcuate in cross section. The light emitting surface 4c converges light as viewed in a vertical surface perpendicular to the primary scanning direction x. As a result, the light emitted from the light emitting surface 4c is formed into a straight line extending in the primary scanning direction X.

As shown in FIGS. 1 and 3, the light guide member 4 is formed with a plurality of projections 40. Each of the projections 40 projects in the insertion direction z. The projections 40 are arranged at equal intervals in the primary scanning direction x. The projections 40 are utilized for positioning the light guide member 4 relative to the first reflector 7A.

Each of the sensor IC chips 5 is a semiconductor chip which is in the form of an elongated rectangle as viewed in plan and includes a light receiving portion (not shown). As shown in FIG. 1, the sensor IC chips 5 are arranged directly below the lens array 6 and mounted on the substrate 2. Each sensor IC chip 5 has a photoelectric conversion function and outputs an image signal of a level corresponding to the received amount of light.

The lens array 6 converges the light reflected by the Document Dc onto the sensor IC chips 5 to form a non-inverted and non-magnified image. The lens array 6 comprises a holder 61 and a plurality of lenses 62. The holder 61 is in the form of a block elongated in the primary scanning direction x and made of e.g. a synthetic resin. The lenses 62 are arranged in the primary scanning direction x and held by the holder 61.

The first and the second reflectors 7A and 7B reflect the light emitted from the side surfaces of the light guide member 4 to return the light into the light guide member 4. The first and the second reflectors 7A and 7B are made of e.g. a white resin. As the material of the first and the second reflectors 7A and 7B, e.g. aluminum, which has a high reflectance, may be employed instead of a white resin. The first and the second reflectors 7A and 7B are elongated in the primary scanning direction x and are arranged to sandwich the light guide member 4.

In the insertion direction z, the first reflector 7A is located between the case 1 and the light guide member 4. As shown in FIGS. 1 and 3, the first reflector 7A is formed with a plurality of holes 7Aa. Each of the holes 7Aa penetrates the first reflector 7A in the insertion direction z and has a circular cross section. The dimension of the holes 7Aa are so set as to fit to the projections 11 of the case 1 and the projections 40 of the light guide member 4.

The holes 7Aa are arranged at equal intervals in the primary scanning direction x. The intervals between the holes 7Aa are so set that the holes fit to the projections 11 of the case 1 and the projections 40 of the light guide member 4. As will be described later, the holes 7Aa and the projections 11 constitute a first fitting contrivance 71 of the present invention. The holes 7Aa and the projections 40 constitute a second fitting contrivance 72 of the present invention.

As shown in FIG. 3, the first reflector 7A is formed with a flange 7Ab at an edge extending in the primary scanning direction x. The flange 7Ab supports the light guide member 4. The flange 7Ab is also utilized for positioning the second reflector 7B, which will be described later.

In the insertion direction z, the second reflector 7B is located on the light guide member 4. As shown in FIGS. 1 and 3, the second reflector 7B is formed with a bottom flange 7Ba and a stepped portion 7Bb. The bottom flange 7Ba extends in the primary scanning direction x and has a rectangular cross section. The dimension of the bottom flange 7Ba is so set that the bottom flange fits into the space defined by the flange 7Ab of the first reflector 7A and an inner surface 1a of the case 1. The bottom flange 7Ba is utilized for positioning the second reflector 7B relative to the case 1. The bottom flange 7Ba, the flange 7Ab and the inner surface 1a of the case 1 constitute a third fitting contrivance of the present invention.

The stepped portion 7Bb extends in the primary scanning direction x and includes a surface oriented upward in the insertion direction z. The stepped portion 7Bb engages the hook 14 of the case 1. The hook 14 and the stepped portion 7Bb constitute an engagement contrivance 74 of the present invention.

The elastic plate 8 serves to fix the substrate 2 to the case 1 and enhance the rigidity of the image reader A1. As shown in FIGS. 1 and 4, the elastic plate 8 has a shape formed by bending a narrow and elongated metal plate, for example. The elastic plate 8 includes a center portion 8a, two edges 8b and a plurality of holes 80. The center portion 8a projects in the thickness direction relative to the neighboring portions. The center portion 8a is pressed against the substrate 2. The edges 8b are bent along a line extending in the primary scanning direction x and fitted in the grooves 13 of the case 1. The holes 80 engage the engagement portions 12 of the case 1. The holes 80 are arranged in two lines extending in the primary scanning direction x.

An example of a method for manufacturing the image reader A1 will be described below with reference to FIGS. 5-9 and also FIGS. 3 and 4, as required.

Figure 5:
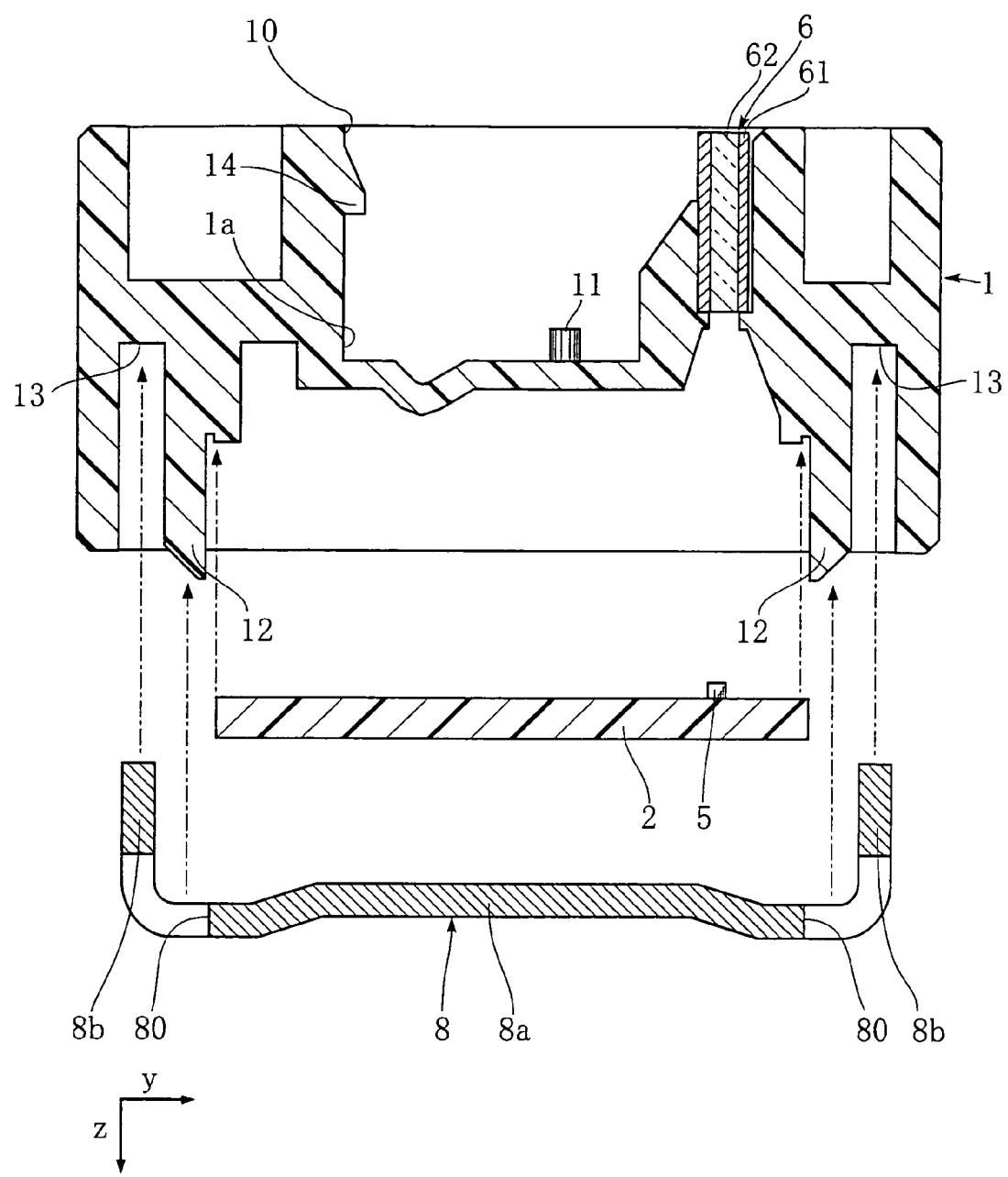
FIG. 5 is a perspective view showing the step of mounting an elastic plate in a method for manufacturing an image reader.
Figure 6:
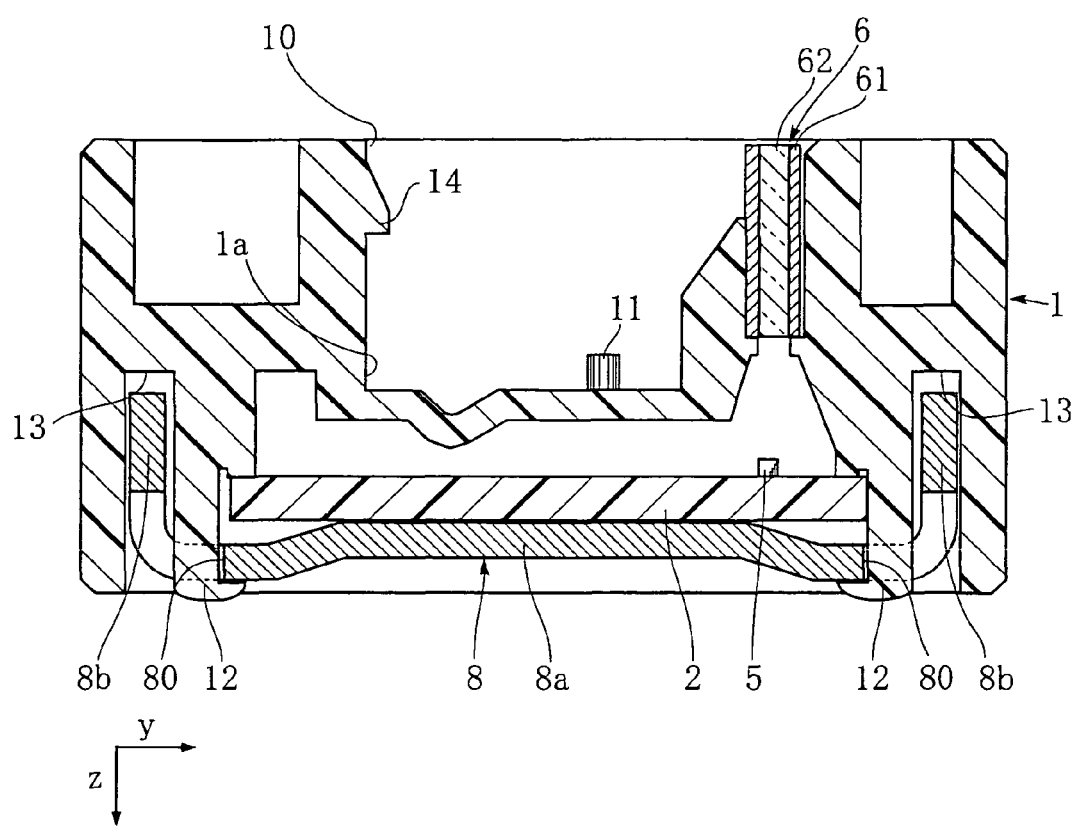
FIG. 6 is a plan view showing the state after thermal caulking is completed in a method for manufacturing an image reader.

FIGS. 5 and 6 show the step of mounting a substrate 2 and an elastic plate 8 to the case 1. Specifically, FIG. 5 shows the step of mounting an elastic plate, whereas FIG. 6 shows the state after thermal caulking is completed.

First, as shown in FIG. 5, a substrate 2 on which a plurality of sensor IC chips 5 are mounted is prepared. The substrate is inserted into a lower portion of a case 1. Then, an elastic plate 8 is mounted to the case 1. Specifically, the two edges 8b of the elastic plate 8 are inserted into grooves 13 of the case 1, and the center portion 8a is moved closer to the substrate 2.

In this process, the engagement portions 12 shown in FIG. 5 are inserted into the holes 80 shown in FIGS. 4 and 5 which are arranged in two lines along the primary scanning direction x. The elastic plate 8 is further moved upward until the center portion 8a is sufficiently pressed against the substrate 2. In this state, the ends of the engagement portions 12 are crushed by applying external force to the ends while heating. As shown in FIG. 3, by this process which is called "thermal caulking", the engagement portions 12 inserted in the holes 80 function to prevent the elastic plate 8 from dropping. In this way, the mounting of the substrate 2 and the elastic plate 8 is completed.

Figure 7:
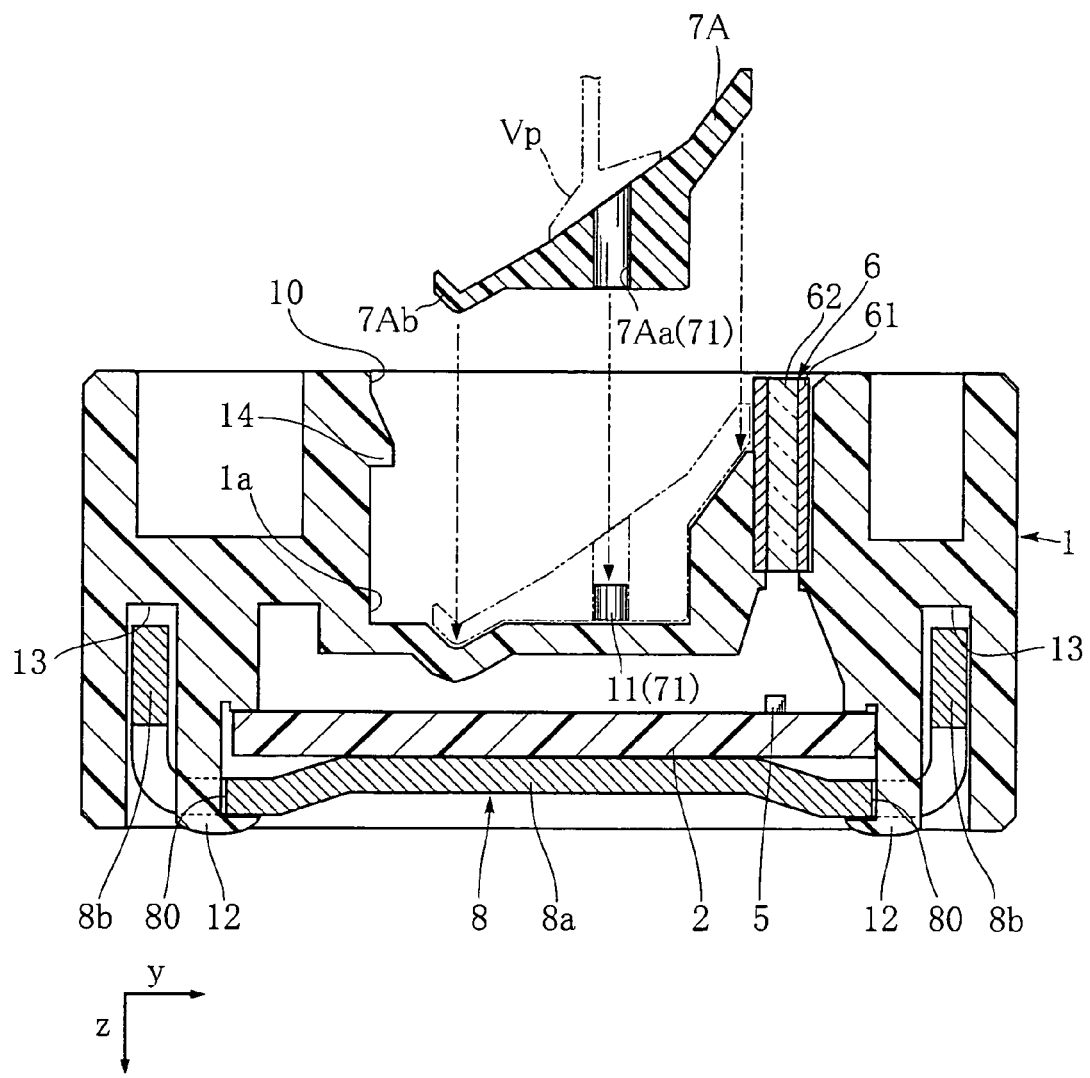
FIG. 7 is a sectional view showing the step of mounting a first reflector in the method for manufacturing an image reader.
Figure 8:
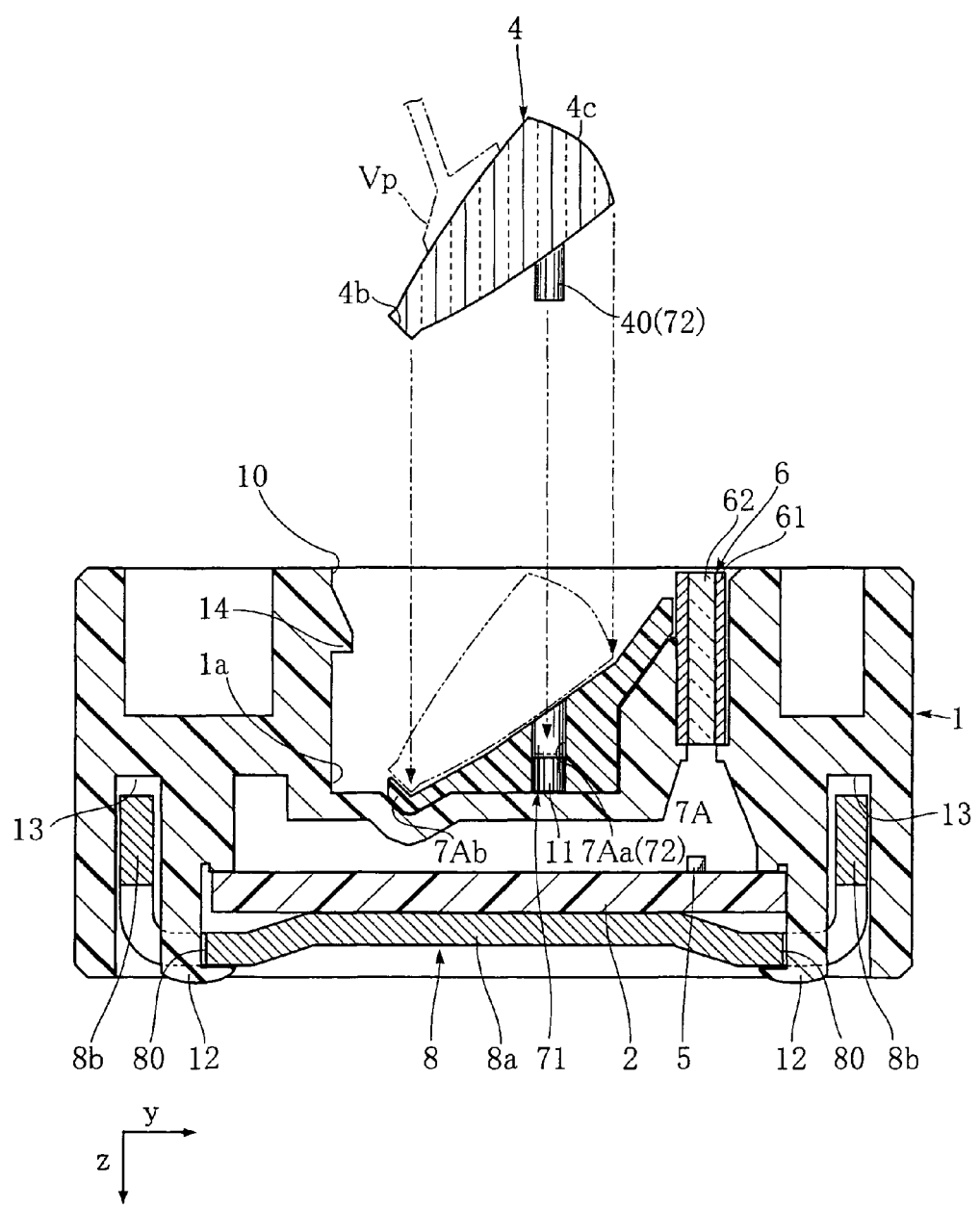
FIG. 8 is a perspective view showing the step of mounting a light guide member and a first and a second reflectors in the method for manufacturing an image reader.
Figure 9:
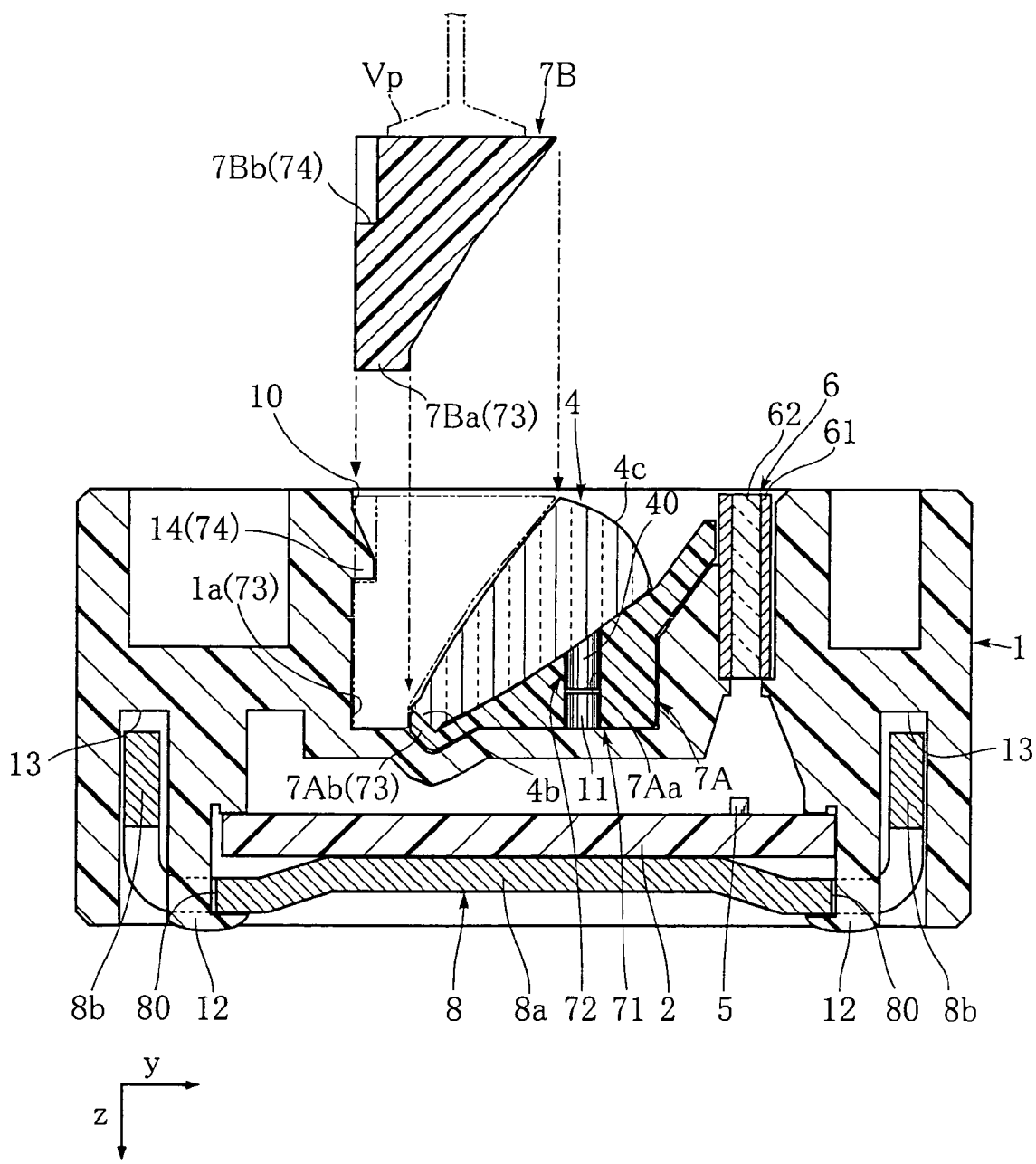
FIG. 9 is a sectional view showing the step of mounting a light guide member in the method for manufacturing an image reader.

FIGS. 7-9 show the step of mounting a light guide member 4 and a first and a second reflectors 7A, 7B to the case 1. Specifically, FIG. 7 shows the step of mounting a first reflector, FIG. 8 shows the step of mounting a light guide member and a first and a second reflectors and FIG. 9 shows the step of mounting a light guide member.

First, as shown in FIG. 7, a first reflector 7A is mounted to the case 1 in the state after the substrate 2 and the elastic plate 8 are mounted. Specifically, the first reflector 7A is held by e.g. a vacuum pad Vp and inserted into the case 1 through the opening 10 in the insertion direction z.

In inserting the first reflector, the holes 7Aa shown in FIGS. 3 and 7 which are arranged in the primary scanning direction x are fitted to the projections 11 shown in FIG. 7. In this way, by the first fitting contrivance 71 made up of the holes 7Aa and the projections 11, the first reflector 7A is properly positioned relative to the case 1.

Then, as shown in FIG. 8, a light guide member 4 is mounted. Specifically, the light guide member 4 is held by e.g. a vacuum pad Vp and inserted into the case 1 through the opening 10 in the insertion direction z. In moving the light guide member 4 closer to the first reflector 7A, the projections 40 are fitted into the holes 7Aa. In this way, by the second fitting contrivance 72 made up of the projections 40 and the holes 7Aa, the light guide member 4 is properly positioned relative to the case 1.

Then, as shown in FIG. 9, a second reflector 7B is mounted. Specifically, the second reflector 7B is held by e.g. a vacuum pad Vp and inserted into the case 1 through the opening 10 in the insertion direction z. In this process, the bottom flange 7Ba of the second reflector 7B is fitted into the space defined by the flange 7Ab and the inner surface 1a. In this way, by the third fitting contrivance 73 made up of the bottom flange 7Ba, the flange 7Ab and the inner surface 1a, the second reflector 7B is properly positioned relative to the case 1.

The advantages of the image reader A1 will be described below.

According to the first embodiment, the light guide member 4, the first reflector 7A and the second reflector 7B are precisely positioned relative to the case 1 by the first fitting contrivance 71, the second fitting contrivance 72 and the third fitting contrivance 73. As a result, linear light impinges on a proper region of the document Dc, so that the content of the document Dc is properly read as an image.

In the structure of the conventional image reader A1, when an attempt to increase the readable range or to slim down the image reader A1 is made, the possibility of deformation such as twisting or warping of the light guide member 4 and the first and the second reflectors 7A, 7B increases. According to the first embodiment, however, the first fitting contrivance 71, the second fitting contrivance 72 and the third fitting contrivance 73 reliably correct such deformation.

The engagement contrivance 74 made up of the hook 14 and the stepped portion 7Bb prevents the second reflector 7B from unintentionally being detached from the case 1. Thus, the light guide member 4 and the first and the second reflectors 7A, 7B are reliably fixed to the case 1. Moreover, the case 1 properly acts to correct the deformation of the light guide member 4 and the first and the second reflectors 7A and 7B.

Since the elastic plate 8 presses the substrate 2 against the case 1, the substrate 2 is properly fixed to the case 1. As a result, the sensor IC chips 5 mounted on the substrate 2 are held at proper positions relative to the light guide member 4 and the lens array 6.

The case 1 is reinforced by the elastic plate 8. Particularly, the elastic plate 8 includes a stepped portion between the center portion 8a and its neighboring portion on each side. The edges 8b of the elastic plate are bent along the primary scanning direction x. With these features, the elastic plate 8 has a high flexural rigidity and a high torsional rigidity, thereby enhancing the rigidity of the image reader A1. Further, the elastic plate 8 and the case 1 are strongly bonded to each other by the above-described "thermal caulking" of the engagement portions 12.

The provision of the paired light source devices 3 increases the amount of linear light emitted from the light guide member 4. The light source devices 3 are so arranged as to face the light incident surfaces 4a comprising the end surfaces of the light guide member 4 which are opposite in the primary scanning direction x. Thus, when the light guide member 4 and the first and the second reflectors 7A and 7B are inserted in the insertion direction z which is perpendicular to the primary scanning direction, these members do not come into contact with the light source devices 3. Further, when the insertion of the light guide member 4 and the first and the second reflectors 7A and 7B is completed, these members are properly positioned relative to the light source devices 3 via the case 1. Thus, the light emitted from the paired light source devices 3 properly impinge on the paired light incident surfaces 4a. As a result, the amount of linear light emitted from the light guide member 4 increases.

In mounting the light guide member 4 and the first and the second reflectors 7A and 7B to the case 1, the fitting of the first fitting contrivance 71, the second fitting contrivance 72 and the third fitting contrivance 73 is achieved just by inserting the light guide member 4 and the first and the second reflectors 7A and 7B in the insertion direction z.

Thus, unlike the conventional structure described before, it is not necessary to assemble the light guide member 4 and the first and the second reflectors 7A and 7B into an integral unit before mounting to the case 1. As a result, the manufacturing efficiency of the image reader A1 is enhanced, while high positioning accuracy in the mounting process is achieved.

The mounting of the light guide member 4 and the first and the second reflectors 7A and 7B to the case 1 can be performed by using e.g. a vacuum pad Vp. By using a vacuum pad Vp, the insertion of these members can be automated, which is advantageous for enhancing the manufacturing efficiency of the image reader A1.

Figure 10:
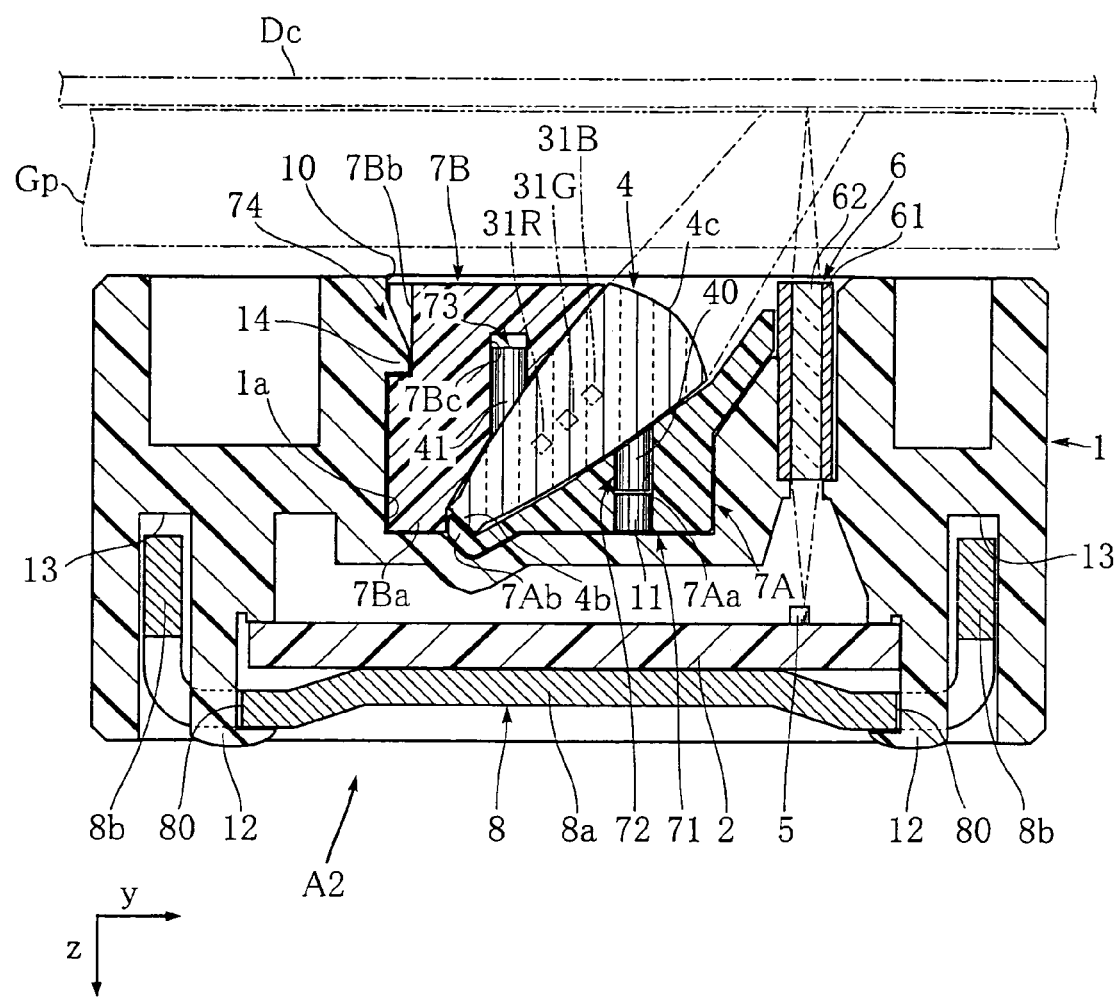
FIG. 10 is a sectional view showing an image reader according to a second embodiment of the present invention.
Figure 11:
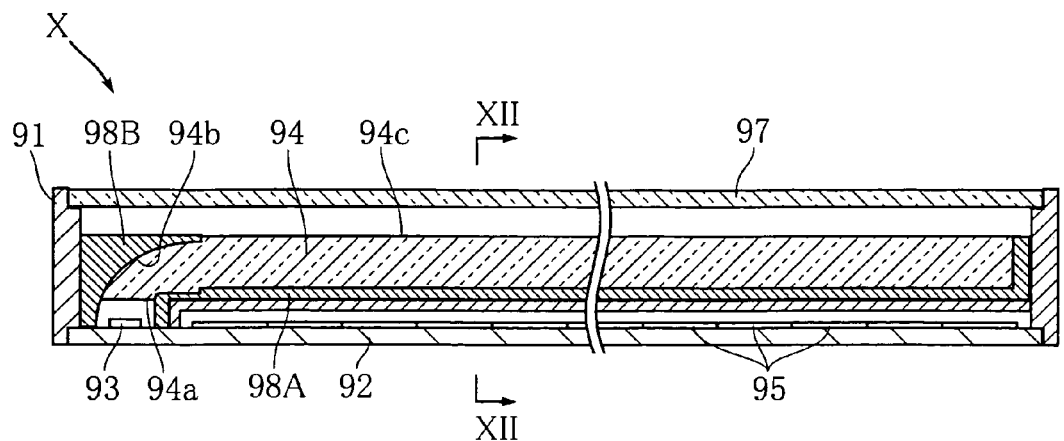
FIG. 11 is a sectional view showing an example of conventional image reader.
Figure 12:
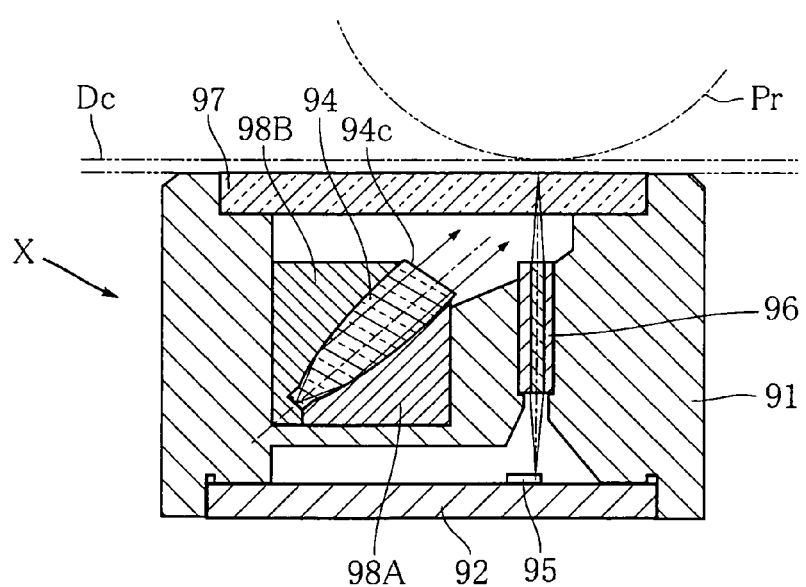
FIG. 12 is a sectional view taken along lines XII-XII in FIG. 11.

FIG. 10 shows an image reader according to a second embodiment of the present invention. In this figure, the elements which are identical or similar to those of the first embodiment are designated by the same reference signs as those used for the first embodiment, and the description thereof will be omitted.

The image reader A2 shown in the figure differs from that of the first embodiment in structure of the third fitting contrivance 73. Specifically, the third fitting contrivance 73 of the second embodiment is made up of a plurality of projections 41 formed at the light guide member 4 and a plurality of recesses 7Bc formed in the second reflector 7B. Each of the projections 41 projects upward in the insertion direction z. The projections 41 are arranged at equal intervals in the primary scanning direction x. Each of the recesses 7Bc extends in the insertion direction z and has a circular cross section. The recesses 7Bc are arranged in the primary scanning direction x at the same pitch as the projections 41.

With the above-described structure, the projections 41 and the recesses 7Bc fit to each other. In this embodiment again, the second reflector 7B is properly positioned relative to the case 1 just by inserting the second reflector 7B into the case.

The image reader and the manufacturing method according to the present invention are not limited to the foregoing embodiments. The specific structure of each part of the image reader and the manufacturing method may be varied in design in many ways.

For instance, the first fitting contrivance 71, the second fitting contrivance 72 and the third fitting contrivance 73 may have a structure different from the foregoing embodiments as long as the fitting can be achieved by the insertion in the insertion direction z. For instance, the first fitting contrivance 71 may be made up of a hole formed in the case 1 and a projection formed at the first reflector 7A to fit into the hole. Further, unlike the foregoing embodiments in which the first and the second fitting contrivance 71 and 72 share the holes 7Aa as their structural element, the first and the second fitting contrivance 71 and 72 may be made up of different structural elements. The engagement contrivance may be made up of a hook formed at the second reflector 7B and a stepped portion formed at the case 1.

The light source of the present invention is not limited to such packaged LED elements as the above light source device 3, and it may be an LED element directly facing the light incident surface 4a. As the light receiving element, a PIN photodiode may be used instead of the sensor IC chip 5.

The invention claimed is:

1. An image reader comprising:
   a light source;
   a light guide member elongated in a primary scanning direction for directing light from the light source to an object to be read as linear light extending in the primary scanning direction;
   a first and a second reflectors elongated in the primary scanning direction and sandwiching the light guide member;
   a plurality of light receiving elements arranged in the primary scanning direction for receiving light reflected by the object to be read; and
   a case formed with an opening for inserting the light guide member and the first and the second reflectors in an insertion direction which is perpendicular to both of the primary scanning direction and a secondary scanning direction;
   wherein the first reflector is located deeper in the case in the insertion direction than the second reflector is, with the light guide member intervening between the first and the second reflectors; and
   the image reader further comprising:
   a first fitting contrivance for positioning the first reflector relative to the case by inserting the first reflector into the case in the insertion direction;
   a second fitting contrivance for positioning the light guide member relative to the case by inserting the light guide member into the case in the insertion direction; and
   a third fitting contrivance for positioning the second reflector relative to the case by inserting the second reflector into the case in the insertion direction.

2. The image reader according to claim 1, further comprising an engagement contrivance for preventing the second reflector from being detached from the case.

3. The image reader according to claim 1, wherein the first fitting contrivance comprises a first projection projecting from an inner surface of a deeper portion of the case in the insertion direction and a hole formed in the first reflector for fitting to the first projection.

4. The image reader according to claim 1, wherein the second fitting contrivance comprises a second projection projecting from the light guide member in the insertion direction and a hole formed in the first reflector for fitting to the second projection.

5. The image reader according to claim 1, wherein the third fitting contrivance comprises an inner surface of the case, a flange formed at the first reflector and a bottom flange formed at the second reflector for fitting into a space defined by the inner surface of the case and the flange of the first reflector.

6. The image reader according to claim 1, wherein the light guide member includes a pair of light incident surfaces at two ends which are opposite in the primary scanning direction; and
   wherein the light source comprises a pair of light source devices facing the light incident surfaces.

7. A method for manufacturing the image reader as set forth in claim 1, the method comprising:
   inserting the first reflector, the light guide member and the second reflector into the case in the mentioned order.

* * * * *